(12) United States Patent
Kouno et al.

(10) Patent No.: US 9,837,957 B2
(45) Date of Patent: Dec. 5, 2017

(54) DIAGNOSTIC METHOD FOR SOLAR POWER SYSTEM AND MONITORING DEVICE

(71) Applicant: Hitachi, Ltd., Chiyoda-ku, Tokyo (JP)

(72) Inventors: Toru Kouno, Tokyo (JP); Atsuhiko Kubo, Tokyo (JP); Yuuichi Nagayama, Tokyo (JP); Tomoharu Nakamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 99 days.

(21) Appl. No.: 15/134,824

(22) Filed: Apr. 21, 2016

(65) Prior Publication Data

US 2016/0315584 A1    Oct. 27, 2016

(30) Foreign Application Priority Data

Apr. 23, 2015    (JP) .................. 2015-088192

(51) Int. Cl.
*G01R 31/26*    (2014.01)
*H02S 50/00*    (2014.01)
*G01R 27/02*    (2006.01)

(52) U.S. Cl.
CPC .............. *H02S 50/00* (2013.01); *G01R 27/02* (2013.01)

(58) Field of Classification Search
CPC ........ G01R 31/40; G01R 31/42; G01R 31/34; G01R 31/343; G01R 31/346; G01R 31/26; H01L 22/00; H01L 31/04; H01L 51/0031

USPC ..................................................... 324/761.01
See application file for complete search history.

(56) References Cited

U.S. PATENT DOCUMENTS

| 8,471,574 | B2* | 6/2013 | Beck | G01R 31/2803 324/522 |
| 2013/0200918 | A1* | 8/2013 | Rubin | G01R 31/2605 324/761.01 |
| 2014/0058688 | A1 | 2/2014 | Kohno et al. | |
| 2016/0359454 | A1* | 12/2016 | Naiknaware | G01R 31/405 |

FOREIGN PATENT DOCUMENTS

| JP | 2012-54401 A | 3/2012 |
| JP | 2012-114108 A | 6/2012 |
| JP | 2014-45073 A | 3/2014 |

* cited by examiner

*Primary Examiner* — Tung X Nguyen
(74) *Attorney, Agent, or Firm* — Crowell & Moring LLP

(57) ABSTRACT

The diagnostic method for a photovoltaic power system includes: a step of storing measured values of voltage and current outputted by a photovoltaic cell array, and identifying a first time period and a second time period with a lower solar radiation amount than in the first time period; a step of calculating the number of faulty photovoltaic cells on the basis of the measured values in the first time period; a step of calculating the number of faulty photovoltaic cells on the basis of the measured values in the second time period; and a step of comparing the number of faulty photovoltaic cells as calculated for the first time period, and the number of faulty photovoltaic cells as calculated for the second time period, and identifying a series resistance of the photovoltaic cells and a value indicating a degree of loss resulting from a fault in the photovoltaic cells.

12 Claims, 13 Drawing Sheets

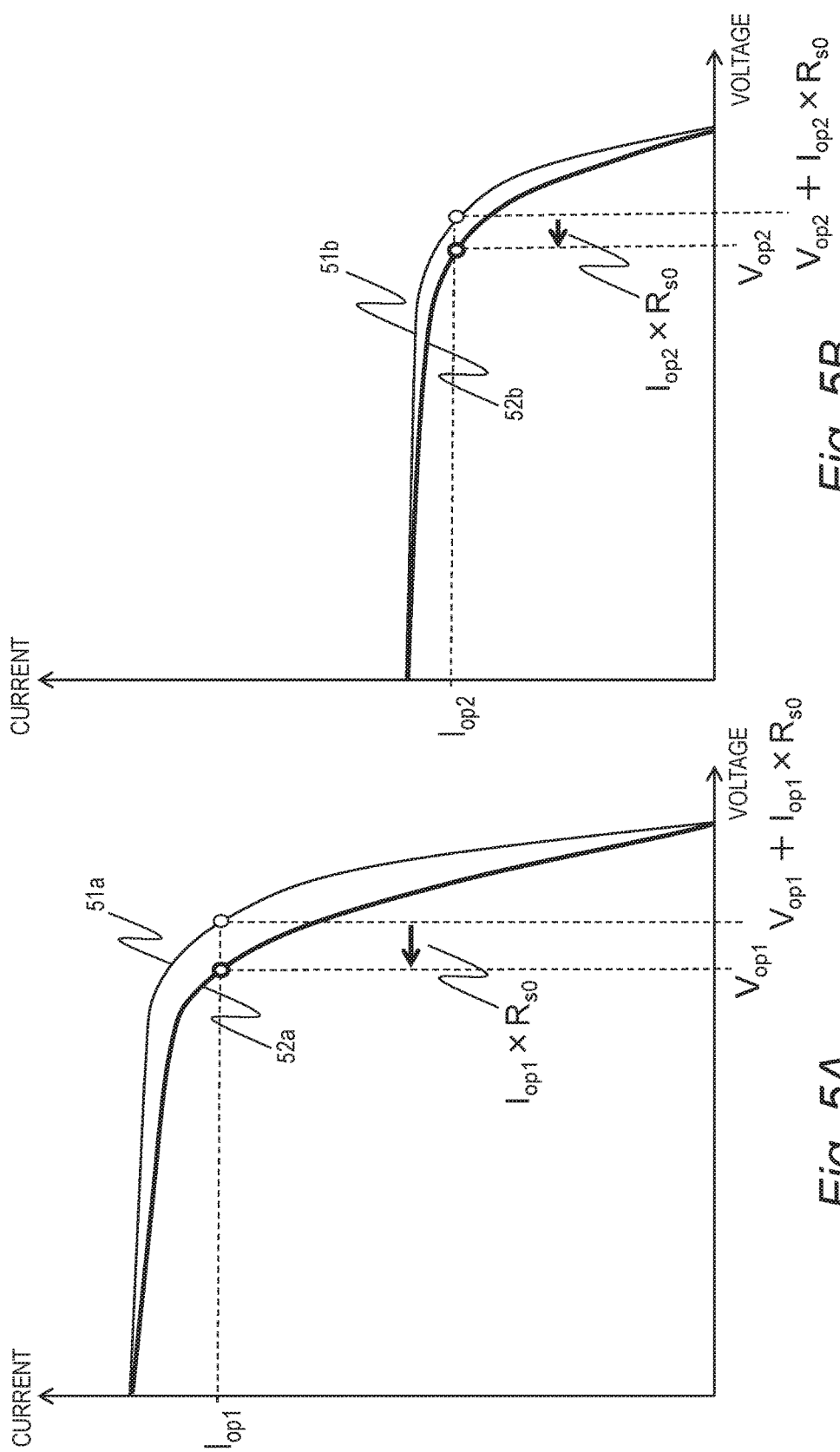

*DIAGNOSIS RESULTS*

| NO | DATE/TIME OF DIAGNOSIS | PCS NO | POWER IN IDEAL STATE KW | ACTUAL POWER KW | FAULT LOSS [%] | DEGRADATION RATE [%] | 5 SECOND DATA DISPLAY |
|---|---|---|---|---|---|---|---|
| 1 | 12/13/2013 12:30:00 | 1 | | | 0.00 | 2.02 | ·Display |
| 2 | 12/13/2013 12:30:00 | 2 | | | 3.00 | 2.12 | ·Display |
| 3 | 12/13/2013 10:10:10 | 1 | | | 0.00 | 2.10 | ·Display |
| 4 | 12/13/2013 10:02:10 | 2 | | | 0.00 | 2.00 | ·Display |
| 5 | 12/13/2013 10:10:10 | 1 | | | 0.00 | 1.99 | ·Display |
| 6 | 12/13/2013 10:02:10 | 2 | | | 0.00 | 2.06 | ·Display |

*Fig. 10A*

| TIME | PCS VOLTAGE V | PCS CURRENT A | TIME | PCS VOLTAGE V | PCS CURRENT A |
|---|---|---|---|---|---|
| 12:30:00 | | | 13:45:00 | | |
| 12:30:05 | | | 13:45:05 | | |
| 12:30:10 | | | 13:45:10 | | |
| 12:59:50 | | | 14:14:50 | | |
| 12:59:55 | | | 14:14:55 | | |
| 13:00:00 | | | 14:15:00 | | |

Fig. 10B

DIAGNOSTIC METHOD FOR SOLAR POWER SYSTEM AND MONITORING DEVICE

CLAIM OF PRIORITY

The present application claims priority from Japanese patent application JP2015-88192 filed on Apr. 23, 2015, the content of which is hereby incorporated by reference into this application.

BACKGROUND OF THE INVENTION

The present invention relates to a fault diagnosis technique by which fault diagnosis of a photovoltaic (PV) module is performed in a PV power system constituted of multiple PV cell modules.

Examples of techniques for fault diagnosis of a PV power system are disclosed in JP 2012-114108 A (Patent Document 1), JP 2012-54401 A (Patent Document 2), and JP 2014-45073 A (Patent Document 3).

Patent Document 1 discloses the following: "the power generation amounts are acquired and stored, the power generation amounts for an evaluation time of a sampling period are calculated, the greatest power generation amounts therein are extracted, and the average thereof is set as a reference value. Also, the power generation amounts during the evaluation time of an evaluation period are calculated, the greatest power generation amounts therein are extracted, and the average thereof is set as an evaluation value. Whether or not there is a fault in the system is determined on the basis of the difference between the reference value and the evaluation value."

Patent Document 2 discloses the following: "power generation information, solar radiation information, and temperature information are acquired, such information is stored, and a system output coefficient during a diagnostic period is calculated and stored along with the temperature during the diagnostic period. A prediction formula is derived from the system output coefficient prior to the day during which diagnosis is to be performed, and using this prediction formula, a predicted system output coefficient is calculated from the temperature during the diagnostic period on the day during which diagnosis is to be performed. The system output coefficient on the day during which diagnosis is to be performed is read in as an actual system output coefficient. When the difference between the predicted system output coefficient and the actual system output coefficient is at or above a certain amount, a fault is diagnosed in the photovoltaic power system and this diagnosis is displayed."

Patent Document 3 discloses the following: "while updating a prescribed coefficient that is the ratio of a short-circuit current to an operating current, according to the photovoltaic cell array state, the solar radiation amount is calculated, and measurement data including an operating current and operating voltage measured by a detection unit is used, thereby calculating an operating temperature and a fault value of a photovoltaic cell module in the photovoltaic cell array."

SUMMARY OF THE INVENTION

In a large-scale PV power system represented by large-scale PV power plants, 200-300 W class PV cell modules are disposed in one power generation site. Each PV cell module has gradually decreased output under the same solar radiation amount and temperature conditions due to degradation over time. The phenomenon of output gradually decreasing is referred to as overall degradation. On the other hand, some modules undergo a sudden decrease in output due to manufacturing quality issues or physical damage. The sudden decrease in output is considered a fault.

Methods for detecting faults in PV cell modules have included visual inspection, testing heat generation using a thermometer, and testing of electrical characteristics or transient responses using a tester, but such tests are performed one-by-one on PV cell modules or PV cell strings (a unit of PV cell modules connected in series), which poses the issue of increased labor and costs required for testing in the case of a large-scale PV power plant. Furthermore, while there are automated test methods in general use in which a measurement means and a communication means are set for each PV cell module or string, this does not fully address the issue of cost increase due to reasons including the reliability of the measurement means.

Employing the techniques of Patent Documents 1-3 does solve the problem of enabling determination of faults in the PV power system without additional measurement means or communication means, but the comparison of the reference value with the evaluation value such as in Patent Document 1 presents the problem that determination accuracy cannot be improved due to varying solar radiation and temperature conditions. The number of actinometers and thermometers is limited to one or at most a few per large-scale PV power plant, which means that a method in which solar radiation information and temperature information are used such as in Patent Document 2 would also not improve measurement accuracy. Patent Document 3 poses the problem that due to the PV cell array to be measured itself being evaluated using an actinometer and thermometer and fault information being extracted while performing feedback, accuracy is high but it is impossible to distinguish overall degradation from a fault.

An object of the present invention is to take into account the above situation and provide a diagnostic method in a large scale PV power generation system in which high accuracy fault detection is maintained without the addition of excess measurement means and communication means, and by which it is possible to distinguish overall degradation from malfunctions.

In order to solve at least one of the foregoing problems, there is provided a diagnostic method for a photovoltaic power system that is executed by a computer system having a processor and a storage device connected to the processor, the photovoltaic power system has a photovoltaic cell array including a plurality of photovoltaic cells connected to each other, the storage device stores measured values of voltage and current that are outputted by the photovoltaic cell array, and the diagnostic method for the photovoltaic power system includes: a first step in which the processor identifies a first time period, and a second time period in which a solar radiation amount incident on the photovoltaic cell array is less than in the first time period; a second step in which the processor calculates a number of faulty said photovoltaic cells on the basis of the measured values in the first time period; a third step in which the processor calculates a number of faulty said photovoltaic cells on the basis of the measured values in the second time period; and a fourth step in which the processor compares the number of faulty said photovoltaic cells as calculated for the first time period, and the number of faulty said photovoltaic cells as calculated for the second time period, and, on the basis of results thereof, identifies a series resistance of the photovoltaic cells and a value indicating a degree of loss resulting from a fault in the photovoltaic cells.

According to one aspect of the present invention, in a large scale photovoltaic power system, it is possible to acquire, at a high accuracy, fault information and overall degradation information in photovoltaic cell modules present inside a photovoltaic cell array without additional measurement means, communication means, actinometers, or thermometers. Problems, configurations, and effects other than what was described above are made clear by the description of embodiments below.

BRIEF DESCRIPTION OF THE DRAWINGS

FIGS. 5A and 5B are descriptive views of examples of changes in characteristics when the PV cell array connected to the power conditioner according to Embodiment 1 of the present invention has undergone overall degradation.

FIGS. 10A and 10B are descriptive views of an example of screens displayed in the PV power system according to Embodiment 1 of the present invention.

DETAILED DESCRIPTION OF EMBODIMENTS

Various embodiments of the present invention will be described below with reference to drawings.

Embodiment 1

Embodiment 1 pertains to a diagnostic method for a photovoltaic (PV) power system in which the intensity of solar radiation (insolation) on a PV cell array is determined according to operating current and voltage of a PV cell array during two selected time periods while changing the series resistance, which is a cause parameter for overall degradation, an operating temperature and fault value of the PV cell array are calculated using the operating voltage and solar radiation intensity, and computation is repeated until the fault values calculated for the respective time periods match, thereby distinguishing loss as a result of a faulty module present in the PV cell array from loss as a result of overall degradation.

Before explaining the embodiments, properties of a PV power system and PV cells in a large-scale PV power plant to which the embodiments are applied will be described.

Figure 1:
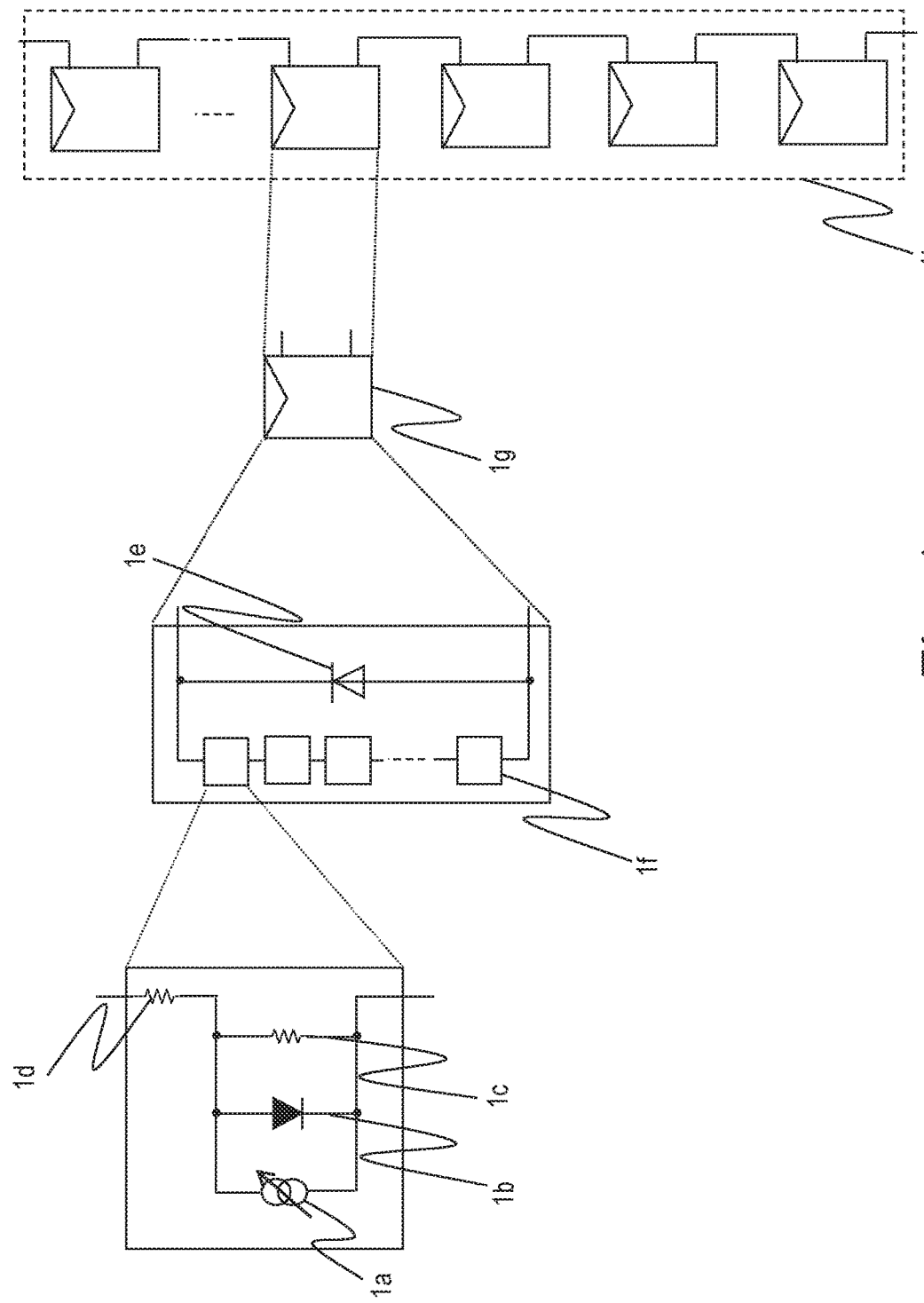
FIG. 1 is a descriptive view of an example of a configuration of a PV cell string according to Embodiment 1 of the present invention.

FIG. 1 is a descriptive view of an example of a configuration of a PV cell string according to Embodiment 1 of the present invention.

As shown in FIG. 1, a PV cell module 1g can be represented as a configuration in which a plurality of PV cells 1f are connected in series, and are split off by a bypass diode 1e. This bypass diode 1e is provided in order to prevent the flow of reverse direction current when the PV cell module 1g is reverse biased. An array of a plurality of PV cell modules 1g connected in series is referred to as a PV cell string 1h. The PV cell 1f can be represented as an equivalent circuit including a current source 1a, a pn junction diode 1b, a shunt resistor 1c, and a series resistor (Rs) 1d. A current in proportion to the solar radiation amount is supplied by the current source 1a.

Figure 2:
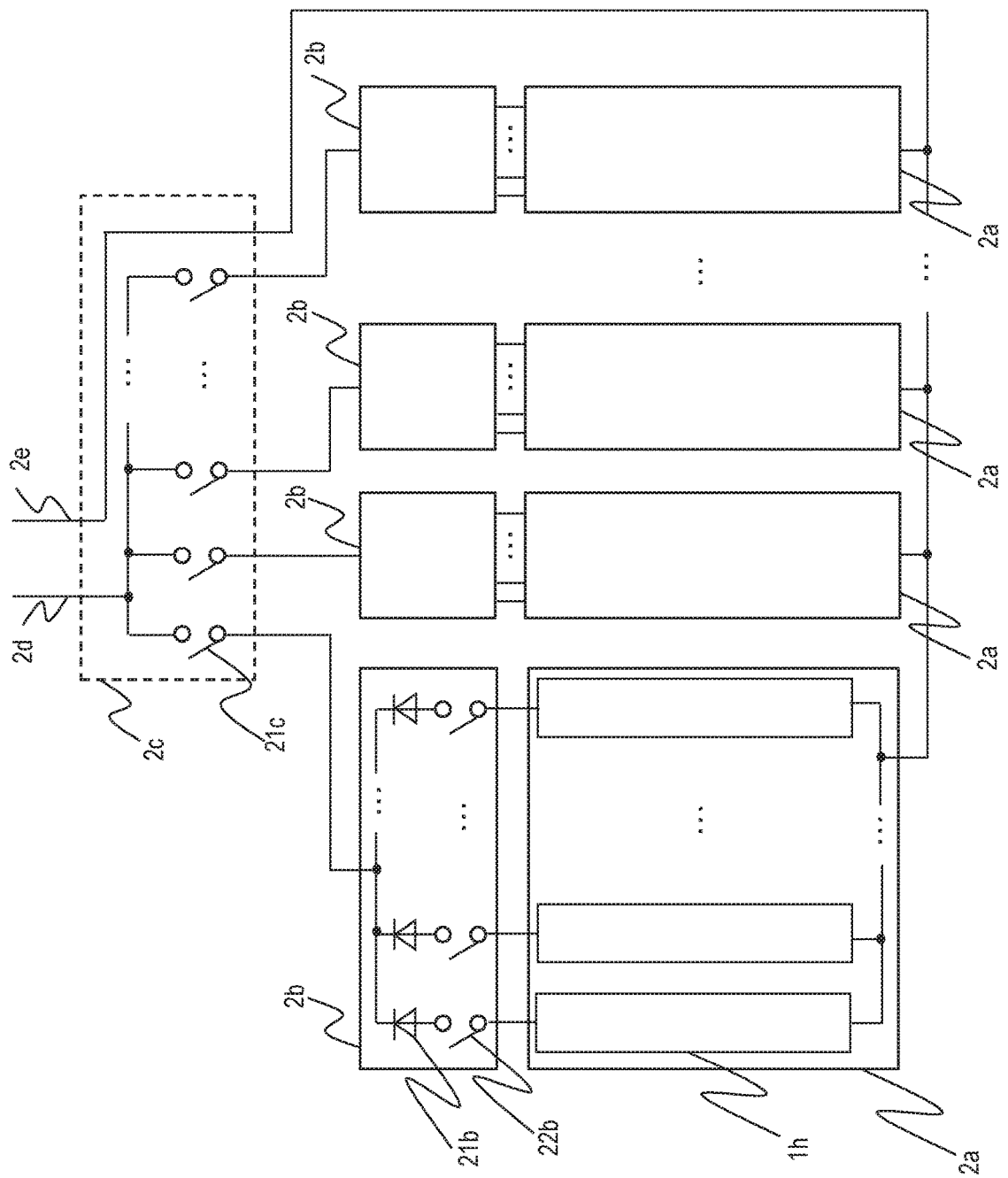
FIG. 2 is a descriptive view of an example of a configuration of a PV cell array according to Embodiment 1 of the present invention.

FIG. 2 is a descriptive view of an example of a configuration of a PV cell array according to Embodiment 1 of the present invention.

As shown in FIG. 2, the PV cell array 2a is configured such that the PV cell strings 1h are connected in parallel in a junction box 2b. The junction box 2b is provided with reverse current prevention diodes 21b for preventing the entry of a reverse direction current to each string 1h. By selecting switches 22b, it is possible to select the current path of each string 1h. A plurality of the junction boxes are further connected in parallel in a current collector rack 2c. In this manner, the plurality of PV cell arrays 2a are connected in parallel. Switches 21c are also provided in the current collector rack 2c and enable selection of the current path for each array 2a. A positive pole 2d and negative pole 2e of the plurality of PV cell arrays 2a connected in parallel are connected to a power conditioner 3 (see FIG. 3).

Figure 3:
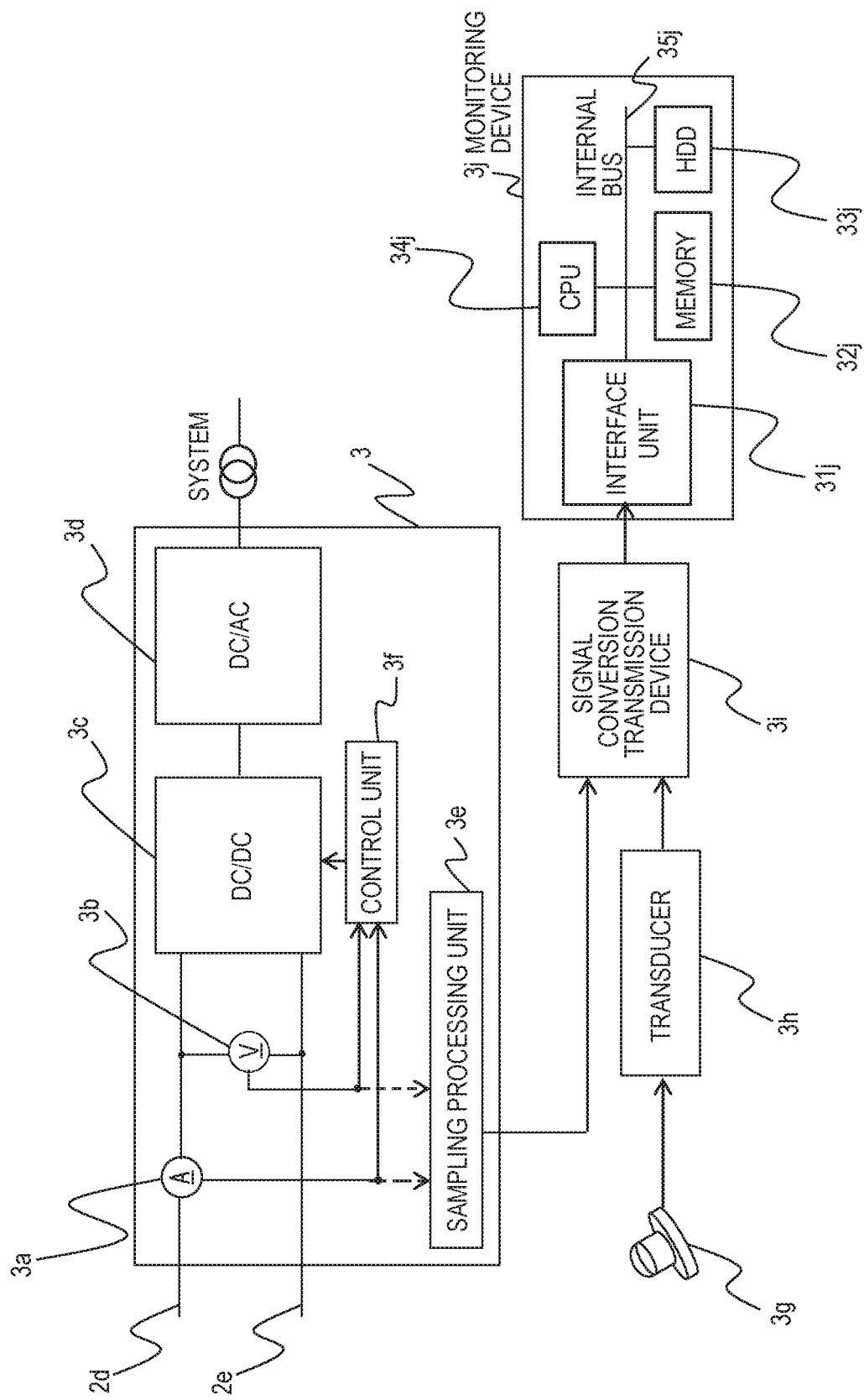
FIG. 3 is a block diagram for describing the configuration and operation of the power conditioner of Embodiment 1 of the present invention.

FIG. 3 is a block diagram for describing the configuration and operation of the power conditioner 3 of Embodiment 1 of the present invention.

Performing control to acquire the maximum power from the plurality of PV cell arrays 2a connected to the current collector rack 2c is referred to as maximum power point tracking (MPPT). Such MPPT is achieved by a control unit 3f using direct current power measured by an ammeter 3a and a voltmeter 3b in the power conditioner 3 to control the operation of a DC/DC converter circuit 3c. The DC/DC converter circuit 3c, which is a direct current boosting converter, boosts the direct current voltage from the PV cell array and supplies this voltage to a DC/AC inverter 3d and alternating current voltage is supplied to the outside.

In general, in a large scale PV power system, the direct current voltage and the direct current measured during MPPT is sampled in a sampling processing unit 3e and then transmitted to a monitoring device 3j through a signal conversion transmission device 3i. The solar radiation intensity or in other words the solar radiation amount per unit area ($kW/m^2$) measured by an actinometer 3g is standardized as a weather signal in a transducer 3h, and transmitted to the monitoring device 3j through the signal conversion transmission device 3i.

The monitoring device 3j is a normal computer, for example. The monitoring device 3j is, for example, constituted of an interface 31j; an internal bus 35j connected to the interface 31j; memory 32j, which is a storage unit connected to the internal bus 35j; a central processing unit (CPU) 34j, which is a processing unit; a hard disk drive (HDD) 33j, which is a storage unit; and the like. The CPU 34j analyzes and monitors data inputted from the signal conversion transmission device 3i by executing various programs stored in the memory 32j. The analyzed data and the like are stored in the HDD 33j, or can be transmitted outside through a network interface that is not shown.

The sampling processing unit 3e of the power conditioner 3 samples the direct current voltage and direct current measured during MPPT at an interval greater than or equal to a frequency that is double the switching control frequency (Nyquist frequency), and furthermore ensures measurement accuracy by averaging a plurality of sampled measurement values. If the switching frequency is 4 kHz, for example, the sampling processing unit 3e performs sampling at a 125 μsec interval and averages eight measurement values sampled over 1 msec. In this case, the measurement error of the measurement value reproduced according to the sampling theorem is kept to $(1/\sqrt{8})=(1/2.828)$, and highly accurate measurement can be realized in a short period.

Typically, one actinometer 3g, which measures solar radiation intensity, is provided per power generation site. In a large scale PV power system, the system is disposed on a large area of land, which results in uneven distribution of solar radiation. Thus, the measured amount of solar radiation is not necessarily the same as the amount of solar radiation on a PV cell array in a certain section. Therefore, using the direct current voltage and direct current measured by the power conditioner 3 during MPPT is effective for highly accurate measurement for fault diagnosis in a large scale power generation site.

Only one power conditioner 3 was shown in FIG. 3, but in reality, a configuration may be adopted in which a plurality of power conditioners 3 are connected to one monitoring device 3j, with each power conditioner 3 being connected to one or more PV cell arrays 2a.

Figure 4A:
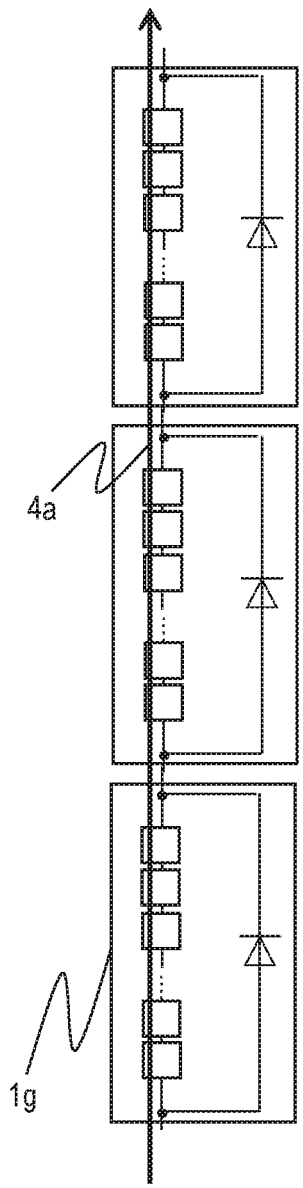
FIGS. 4A and 4B are descriptive views of an example of a current path when a fault has occurred in the PV cell module according to Embodiment 1 of the present invention.
Figure 4B:
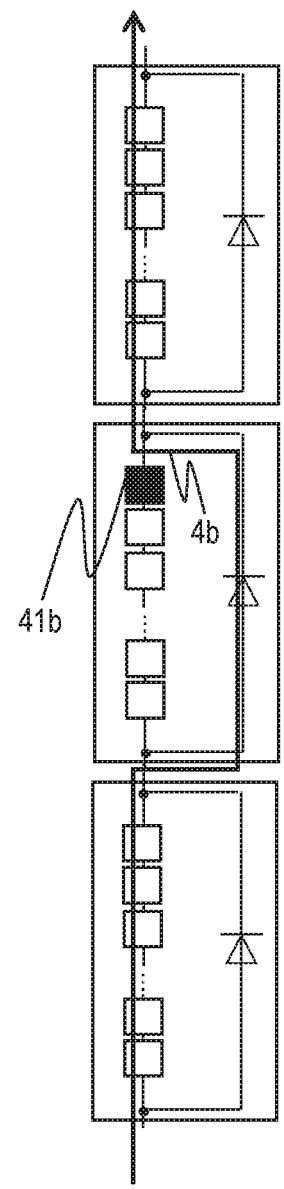

FIGS. 4A and 4B are descriptive views of an example of a current path when a fault has occurred in the PV cell module according to Embodiment 1 of the present invention.

If a PV cell 41b or the like changes from a normal state to having a hotspot, the current path is switched from the current path 4a shown in FIG. 4A to the current path 4b shown in FIG. 4B. Whereas the normal state current path 4a passes through each of the PV cells 1f inside each PV cell module 1g, the current path 4b passes through the bypass diode 1e in the PV cell module 1g including the PV cell 41b having the hotspot. A hotspot refers to a phenomenon whereby a PV cell in an abnormal state is at a higher temperature than surrounding PV cells, and the fault diagnosis for detecting hotspots typically involves the use of thermal cameras or the like. The PV cell 41b, which has the hotspot, has a dramatically decreased current drive performance, and the current flows through the bypass diode 1e from a certain point.

In the present embodiment, a fault in the PV cell module 1g refers to a state in which the bypass diode 1e in the PV cell module 1g is ON (that is, the current is flowing through the bypass diode 1e and not the PV cells 1f in the PV cell module 1g). Such a state occurs due to line disconnection or the like in the PV cell module 1g, for example. As shown in FIG. 1, each PV cell module 1g includes a plurality of PV cells 1f, and thus, all PV cells 1f included in the PV cell module 1g where the bypass diode 1e is ON are treated as being faulty. If there are an N number of PV cells 1f in each PV cell module 1g, for example, N times the number of PV cell modules 1g described below is equivalent to the number of faulty PV cells 1f. The ratio of the number of faulty PV cell modules 1g to the total number of PV cell modules 1g in the PV cell array 2a is equal to the ratio of the number of faulty PV cells 1f to the total number of PV cells 1f in the PV cell array 2a, for example.

Meanwhile, degradation refers to an increase in loss of power resulting from an increase in series resistance in each PV cell 1f. Normally, the series resistance 1d of the PV cells 1f constituting the PV cell array 2a gradually increases. A state in which the series resistance 1d increases but the bypass diode 1e is not ON indicates degradation. If, as a result of a dramatic increase in series resistance 1d of a certain PV cell 1f, the bypass diode 1e of the PV cell module 1g including this PV cell 1f turns ON, the PV cell module 1g (that is, all PV cells 1f included in the PV cell module 1g) is treated as being faulty.

Next, the computation method for the PV cell array will be described. The formula for the PV cell module constituted of N cells (Ncell) can be expressed as the following formula (1) using the following parameters: I: output current [A]; Is: reverse saturation current [A]; V: output voltage [V]; Isc: short-circuit current [A]; T: absolute temperature of PV cell element [K]; k: Boltzmann constant [J/K]; Rs: wiring resistance [O]; electron charge [C]; Rsh parallel resistance [Q]; nf junction constant; and p: solar radiation amount [kW/m²].

$$I = Isc \cdot p - Is \cdot \{\exp(q \cdot (V/(Ncell) + Rs \cdot I)/(nf \cdot k \cdot T)) \} - (V/(Ncell) + Rs \cdot I)/Rsh \quad (1)$$

Next, the method for calculating the current-voltage characteristics of the PV cell array 2a will be described. In the present specification, calculation of this array is referred to as an "array operation." Array operation is realized by combining string analysis and array analysis. When performing string analysis, the same current flows through a plurality of modules, and thus, the module voltages V[1], V[2], V[3], ... V[N−1], and V[N] when a certain current I is flowing are calculated by formula (1), and the sum Vstring thereof is determined. If the voltage is calculated according to formula (1), the voltage can be determined with ease by repeated calculation such as Newton's method, although this involves the use of an inverse function. If the current flows through the bypass diode 1e, calculation is performed with the module voltage≈0.

When performing array analysis, the same voltage is present in the plurality of PV cell strings 1h, and thus, the currents I[1], I[2], ... I[N] for each string when a certain voltage V is being applied thereon are determined according to formula (1) and the sum Iarray thereof is determined. In other words, array operation is performed by combining string analysis and array analysis to determine current-voltage characteristics of the PV cell array.

FIGS. 5A and 5B are descriptive views of examples of changes in characteristics when the PV cell array connected to the power conditioner 3 according to Embodiment 1 of the present invention has undergone overall degradation.

In general, a known reason for degradation in the PV cell module 1g is that the solder of the interconnector that connects adjacent cells 1f in the PV cell module 1g gradually peels off. Such degradation occurs in the PV cell array 2a overall, and thus, the series resistance 1d in FIG. 1 increases overall in the PV cells 1f constituting the PV cell array 2a.

FIG. 5A shows current-voltage characteristics according to high solar radiation conditions. In an initial state, characteristics are as indicated by the curve 51a, and an operating current Iop1 is obtained by performing MPPT on the power conditioner 3. If the PV cell array 2a gradually degrades and the series resistance on the PV cell array level becomes Rs0, then a voltage drop of Rs0×Iop1 occurs, resulting in a transition to the characteristics indicated by the curve 52a.

Similarly, during low solar radiation conditions, as shown in FIG. 5B, a voltage drop of Rs0×Iop2 from the operating voltage Vop2 occurs due to the transition from the initial state curve 51b to characteristics indicated by the curve 52b. Since Iop1>Iop2, there is a greater voltage drop under high solar radiation conditions, which also means a greater loss amount.

If the ratio of the power consumed by the series resistance 1d of all PV cells 1f of the PV cell array 2a in relation to the sum of the power consumed by the series resistance 1d in all PV cells 1f of the PV cell array 2a and the power consumed by a load connected to the PV cell array 2a is defined as the loss due to degradation of power outputted by the PV cell array 2a, then the loss due to degradation becomes greater as the solar radiation amount increases and the amount of current outputted by the PV cell array 2a increases.

By contrast, if a fault occurs and the bypass diode 1e turns ON, then the amount of power consumed by the bypass diode 1e is negligible. Thus, if the ratio of the number of PV cell modules 1g that are not generating power (that is, with bypass diodes 1e that are ON due to a fault) in relation to the total number of PV cell modules 1g is defined as the loss due to a fault in the power outputted by the PV cell array 2a, then the loss due to a fault is uniform regardless of the solar radiation amount.

As described above, the monitoring device 3j of the present embodiment relies on the fact that the fluctuation in loss due to degradation in relation to the fluctuation in solar radiation amount differs from the fluctuation in loss resulting from a fault, to differentiate loss due to degradation from loss resulting from a fault by estimating the series resistance 1d and the fault value of the PV cell module 1g, which are consistent with the voltage and current of the PV cell array 2a measured during two time periods with differing solar radiation amounts.

Below, a diagnostic method for a PV power system of the present embodiment will be described in which loss due to overall degradation of the PV cell array 2a is differentiated with high accuracy from loss due to a fault in the PV cell array 2a according to measured values from the power conditioner 3.

Figure 6A:
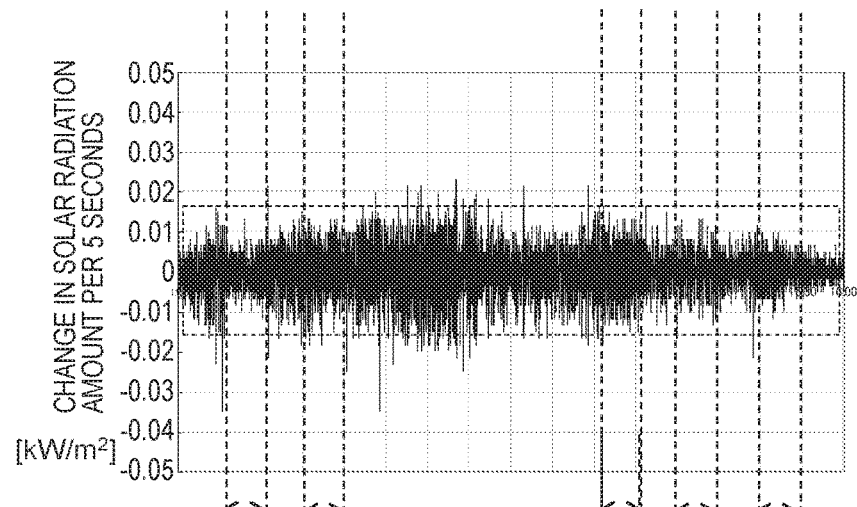
FIGS. 6A and 6A are descriptive views of an example of observed solar radiation amounts during one day in a PV power system according to Embodiment 1 of the present invention.

FIGS. 6A and 6A are descriptive views of an example of observed solar radiation amounts during one day in the PV power system according to Embodiment 1 of the present invention.

Figure 6B:
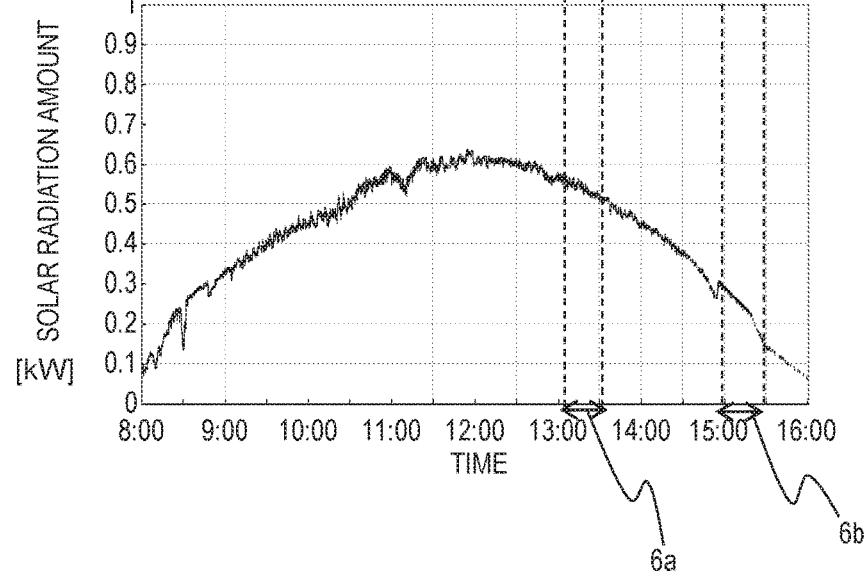

Specifically, FIGS. 6A and 6B respectively show the amounts of change in solar radiation and the observed amounts of solar radiation on a clear day. The observed amounts of solar radiation as measured at a prescribed interval (every 5 seconds, for example) are shown in FIG. 6B, and the difference between the respective observed amounts and the immediately previously observed amounts (5 seconds prior, for example) are shown in FIG. 6A as the amounts of change in solar radiation, for example. The monitoring device 3j first defines a state in which the amount of change in solar radiation is less than a prescribed value (±0.15 kW/m$^2$, for example) for a prescribed period of time (30 minutes, for example) as a stable time period. In FIGS. 6A and 6B, five stable time periods are selected. Of the selected time periods, the monitoring device 3j defines a time period 6a having the largest solar radiation amount as a time period at a start time (1), and a time period 6b with the smallest amount of solar radiation as a start time (2). Here, the monitoring device 3j does not perform diagnosis if the difference in average solar radiation amount during the time period at the start time (1) and the time period at the start time (2) is less than a prescribed value, and only performs diagnosis if the average solar radiation amount is greater than a prescribed value.

The reason that time periods where the solar radiation amount is stable are selected as described above is that, although the calculations described below assume that MPPT is being performed, if the solar radiation amount is unstable, the controls by the power conditioner 3 cannot keep up with the changes in solar radiation amount, which means that the voltage and current might not be measured at the maximum power outputted by the PV cell array 2a. Thus, the stability requirements for the solar radiation amount differ depending on the performance of the power conditioner 3 and the accuracy required of results of calculation to be described below. If the power conditioner 3 is at a sufficiently high performance, or if the accuracy required for calculation results is not very high, for example, then this means that the stability required for the solar radiation amount might not be not very high.

Also, the present embodiment relies on the fact that change in loss due to degradation and change in loss due to a fault with respect to the change in solar radiation amount differ, and thus, if the solar radiation amount differs between the two time periods, the calculation described below can be performed. However, since it can be expected that the accuracy in differentiation between loss due to degradation and loss due to a fault is greater when the difference in solar radiation amount is greater, it is preferable that, of the time periods over which the solar radiation amount is stable during a prescribed period (one day, for example), a time period with the maximum solar radiation amount and a time period with the minimum solar radiation amount be selected.

Regarding the two time periods selected as described above, the following three actions are taken: estimation of initial characteristics of the PV cell array 2a, calculation of the solar radiation amount incident on the PV cell array 2a, and calculation of the estimated temperature of the PV cell array 2a.

Figure 7A:
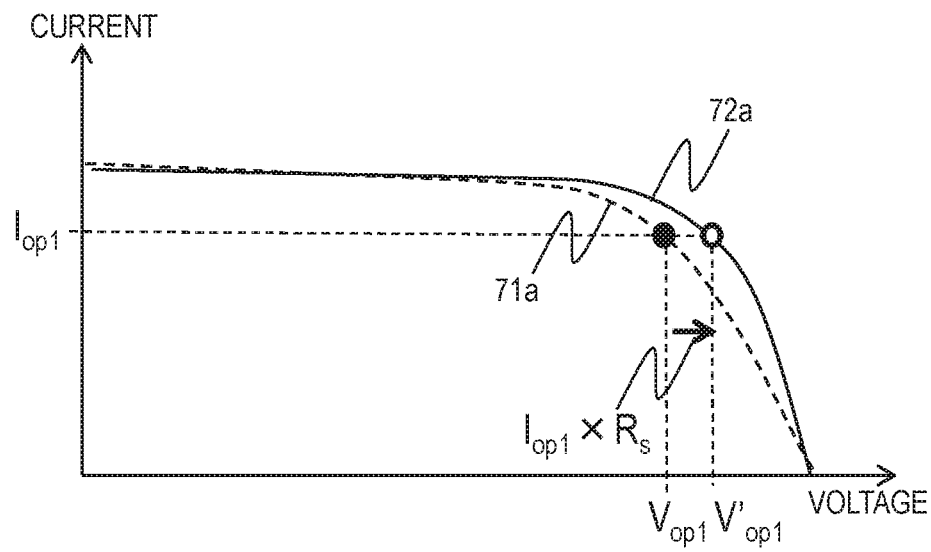
FIGS. 7A to 7C are descriptive views of examples of the estimation of initial characteristics of the PV cell array, calculation of the amount of solar radiation, and calculation of estimated temperature according to Embodiment 1 of the present invention.
Figure 7B:
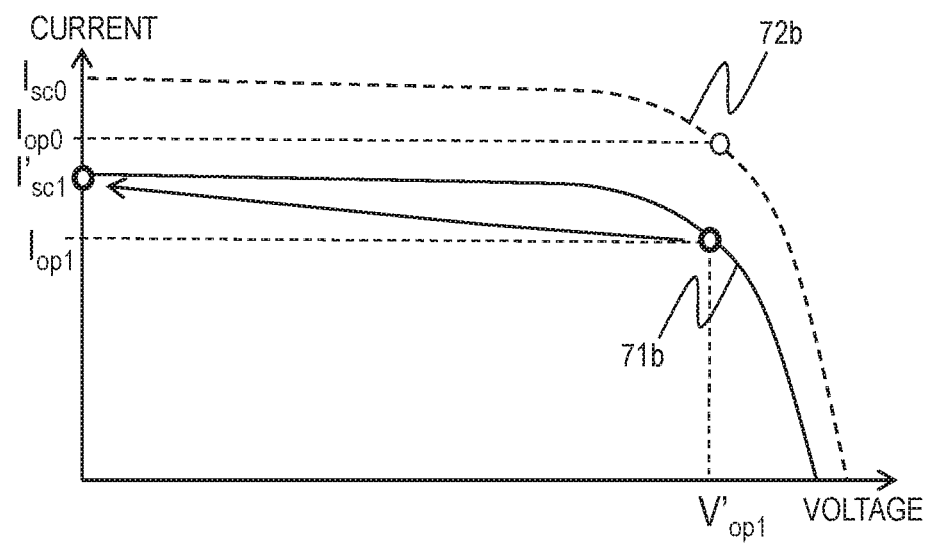
Figure 7C:
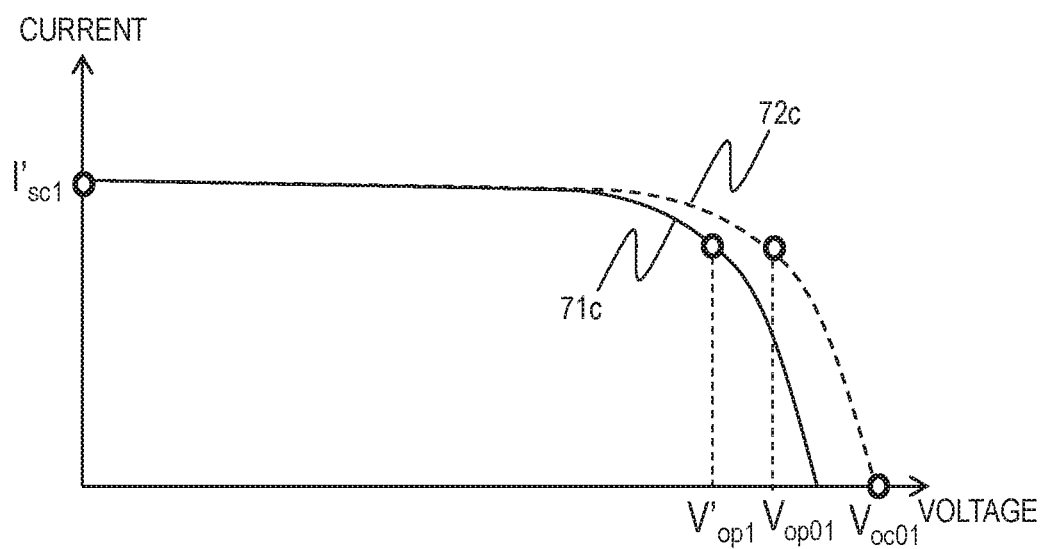

FIGS. 7A to 7C are descriptive views of examples of the estimation of initial characteristics of the PV cell array, calculation of the amount of solar radiation, and calculation of the estimated temperature according to Embodiment 1 of the present invention.

As shown in FIG. 7A, first, the monitoring device 3j estimates initial characteristics 72a of the PV cell array 2a by setting a prescribed series resistance Rs according to the operating voltage Vop1 and operating current Iop1 on the curve 71a attained by controls performed by the power conditioner 3, and setting an operating voltage V'op1 by adding (Iop1×Rs) to Vop1.

In order to calculate the estimated solar radiation amount, the monitoring device 3j uses a ratio J between the operating current and the short-circuit current. Regarding the constant J, it is found that there is a very high correlation between the operating current and the short-circuit current regardless of manufacturing variation and type of PV cell module, based on evaluation of tens of thousands of 100-200 W class PV cell modules that constitute a large scale PV power system. Additionally, it is confirmed that even in the range of 0.1-1.0 kW/m$^2$ for the solar radiation amount and the temperature range during actual use under which MPPT is performed, the ratio J of the operating current and short-circuit current is substantially constant. In FIG. 7B, if the short-circuit current and maximum operating current, on a reference characteristic curve 72$b$ at a reference state of a solar radiation amount of 1.0 kW/m$^2$ and 25° C., are respectively defined as Isc0 and Iop0 in relation to the operating current Iop1 on the curve 71$b$ estimated as the initial state, the short-circuit current I' sc1 on the curve 71$b$ is determined according to formulae (2) and (3), and with the operating temperature as Tb, the estimated solar radiation amount pb is determined by formulae (4) and (5) using a temperature coefficient α of the short-circuit current.

$$J = Iop0/Isc0 \quad (2)$$

$$I'sc1 = Iop1/J \quad (3)$$

$$Isc0[Tb] = Isc0 + \alpha \cdot (Tb - 25) \quad (4)$$

$$pb = (I'sc1)/Isc0[Tb] \quad (5)$$

Typically, a thermocouple is used for the temperature sensor, but the measurement accuracy of thermocouples are generally low. Therefore, in the diagnostic method of the present embodiment, the monitoring device 3$j$ also calculates the estimated operating temperature from the operating current Iop1 and operating voltage V'op1. As shown in FIG. 7C, a reference characteristic curve 72$c$ at normal temperature is used as a reference for when the short-circuit current is I'sc1. At the estimated temperature Tb to be determined, with a temperature coefficient β [V/° C.] of an open-circuit voltage, the open-circuit voltage V' oc1 of the estimated initial characteristic curve 71$c$ can be expressed as formula (6) when the open-circuit voltage at a normal temperature of 25° C. is Voc01.

$$V'oc1 = Voc01 + \beta \cdot (Tb - 25) \quad (6)$$

The open-circuit voltage Voc01 at the normal temperature of 25° C. can be determined by plugging in pb for the solar radiation amount p, 25° C. for the temperature T, and 0 A for the current I in formula (1). Next, when using the aforementioned coefficient J, formula (7) is similarly formed under the condition of an operating temperature of Tb.

$$Ipmax\_b = J \cdot Isc\_b \cdot pb \quad (7)$$

Here, Isc_b is the short-circuit current at the temperature Tb and solar radiation amount 1.0 kW/m$^2$.

The operating voltage V'op1 and the open-circuit voltage V'oc1 are represented by formulae (8) and (9).

$$V'op1 = Ncell(nf \cdot k \cdot Tb)/q \cdot \ln\{(Isc\_b \cdot pb - Ipmax\_b)/Is\} \quad (8)$$

$$V'oc1 = Ncell \cdot (nf \cdot k \cdot Tb)/q \cdot \ln\{(Isc\_b \cdot pb)/Is\} \quad (9)$$

Combining formulae (8) and (9) results in formula (10), and by inserting formula (6) therein, formula (11) is created.

$$V'op1 - V'oc1 = Ncell \cdot ((nf \cdot k \cdot Tb)/q) \cdot \ln(1 - J) \quad (10)$$

$$Tb = (V'op1 - Voc01 - \beta \cdot 25)/(Ncell \cdot (nf \cdot k/q) \cdot \ln(1-J) + \beta) \quad (11)$$

In other words, by solving a primary equation, it is possible to calculate the operating temperature Tb from the open-circuit voltage at the voltage V'op1 and normal temperature estimated as initial characteristics from the operating voltage Vop1 measured by the power conditioner 3.

As described above, in the diagnostic method of the present embodiment, by using a method of calculating the solar radiation amount per unit area, which is the solar radiation intensity, from measured values by the power conditioner 3 at two selected time periods, using a method for calculating the operating temperature, and using array operation, it is possible to determine a fault value as fault information of the PV cell modules 1$g$ present in the PV cell array 2$a$, and the series resistance 1$d$ as overall degradation information.

Figure 8A:
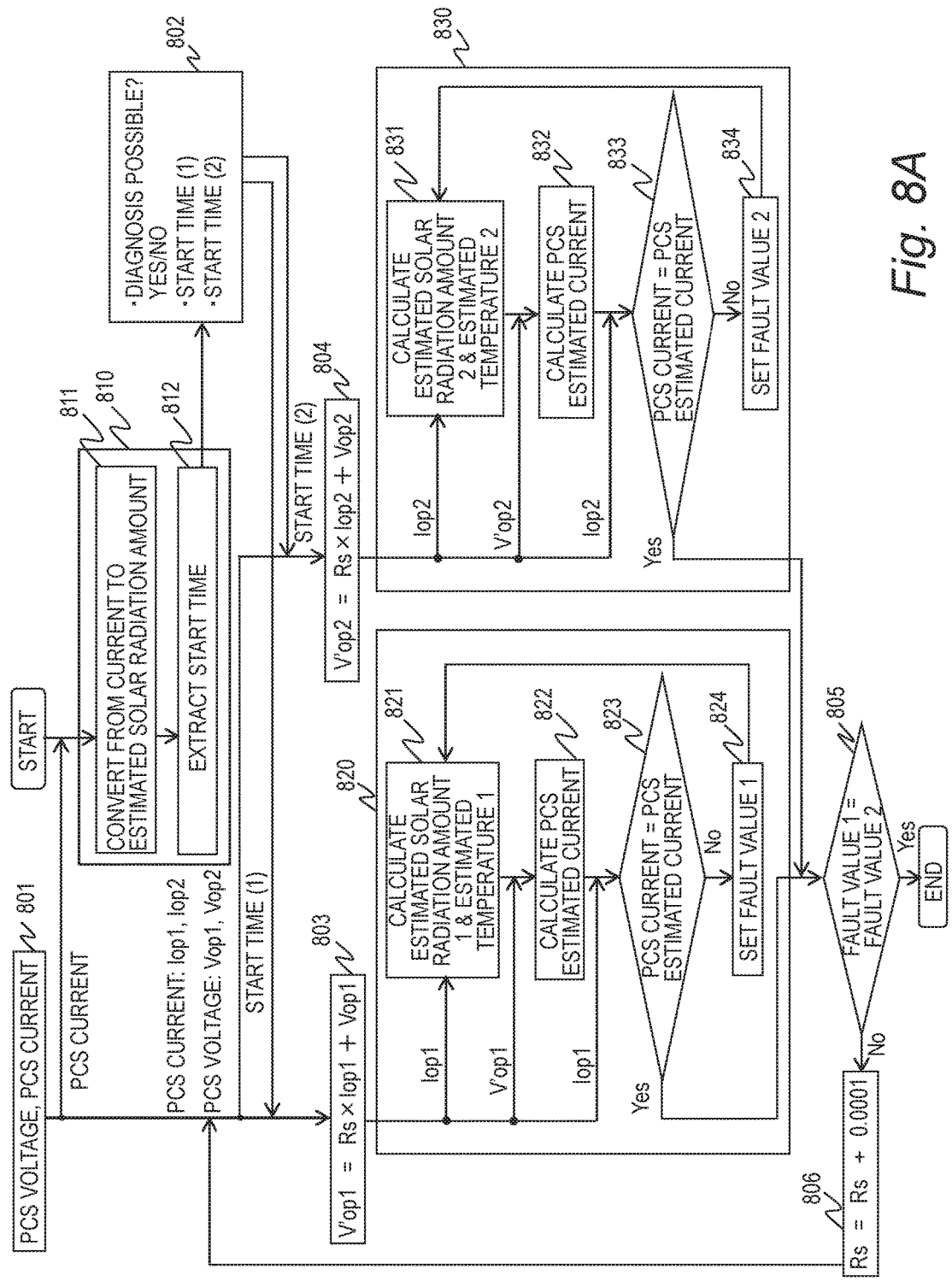
FIG. 8A is a flow chart showing one example of an operation algorithm of all processes to calculate the fault value and series resistance of the PV power system according to Embodiment 1 of the present invention.

FIG. 8A is a flow chart showing one example of an operation algorithm of all processes to calculate the fault value and series resistance of the PV power system according to Embodiment 1 of the present invention.

When the monitoring device 3$j$ receives the voltage and current 801 (hereinafter respectively referred to as "PCS (power conditioner system) voltage" and "PCS current"), measured by the voltmeter 3$b$ and ammeter 3$a$ of the power conditioner 3 through the signal conversion transmission device 3$i$, the monitoring device 3$j$ performs the process of FIG. 8A. Specifically, the PCS voltage and PCS current 801 received by the interface 31$j$ are stored in the storage device (such as the memory 32$j$ or HDD 33$j$) of the monitoring device 3$j$, and the CPU 34$j$ executes the process of FIG. 8A according to a program stored in the memory 32$j$. This similarly applies to the process of FIGS. 8B and 9 to be described below.

First, the monitoring device 3$j$ extracts the start time from the PCS current in an operation block 810. Specifically, the monitoring device 3$j$ calculates the solar radiation amount (estimated solar radiation amount) incident on the PV cell array 2$a$ from the PCS current (step 811), and using the estimated solar radiation amount, extracts the start time by the method described with reference to FIGS. 6A and 6B (step 812). Furthermore, the monitoring device 3$j$ determines whether or not diagnosis is possible by the method described with reference to FIGS. 6A and 6B, and if diagnosis is possible, sets a time period starting from the start time (1) and a time period starting from the start time (2).

In order to extract the start time and determine whether or not diagnosis is possible by the method shown in FIGS. 6A and 6B, it is sufficient to know the differences in measured solar radiation amount, and there is no need to know the absolute values of the solar radiation amounts at the respective times. Thus, in step 811, there is no need to calculate the estimated solar radiation amount by a method similar to steps 821 and the like to be described later, and the value of the PCS current itself may be used as the estimated solar radiation amount, for example. Alternatively, the solar radiation amount calculated by the actinometer 3$g$ may be used instead of the estimated solar radiation amount.

Next, the monitoring device 3$j$ uses the average PCS voltage and PCS voltage, that is, Vop1 and Iop1, at the time period at the start time (1) and the series resistance Rs set at a prescribed value, to determine the operating voltage V'op1 when the PV cell array 2$a$ is at an initial state at the time period at the start time (1) (step 803). This calculation is performed by the method shown in FIG. 7A. The monitoring device 3$j$ similarly uses the average PCS voltage and PCS voltage, that is, Vop2 and Iop2, at the time period at the start time (2) and the series resistance Rs set at a prescribed value, to determine the operating voltage V'op2 when the PV cell array 2$a$ is at an initial state at the time period at the start time (2) (step 804). The initial value of the series resistance Rs in the calculation above is 0, for example, and may gradually increase in step 806 to be described below.

Next, the monitoring device 3$j$ executes an operation block 820 at the time period at the start time (1) and executes an operation block 830 at the time period at the start time (2). In the operation block 820, the monitoring device 3$j$ calculates the estimated solar radiation amount 1 and the estimated temperature 1 of the PV cell array 2$a$ in the time period at the start time (1) (step 821), and in the operation block 830, the monitoring device 3$j$ calculates the estimated solar radiation amount 2 and the estimated temperature 2 of the PV cell array 2a in the time period at the start time (2) (step 831). The details of these processes will be explained with reference to FIG. 8B.

Figure 8B:
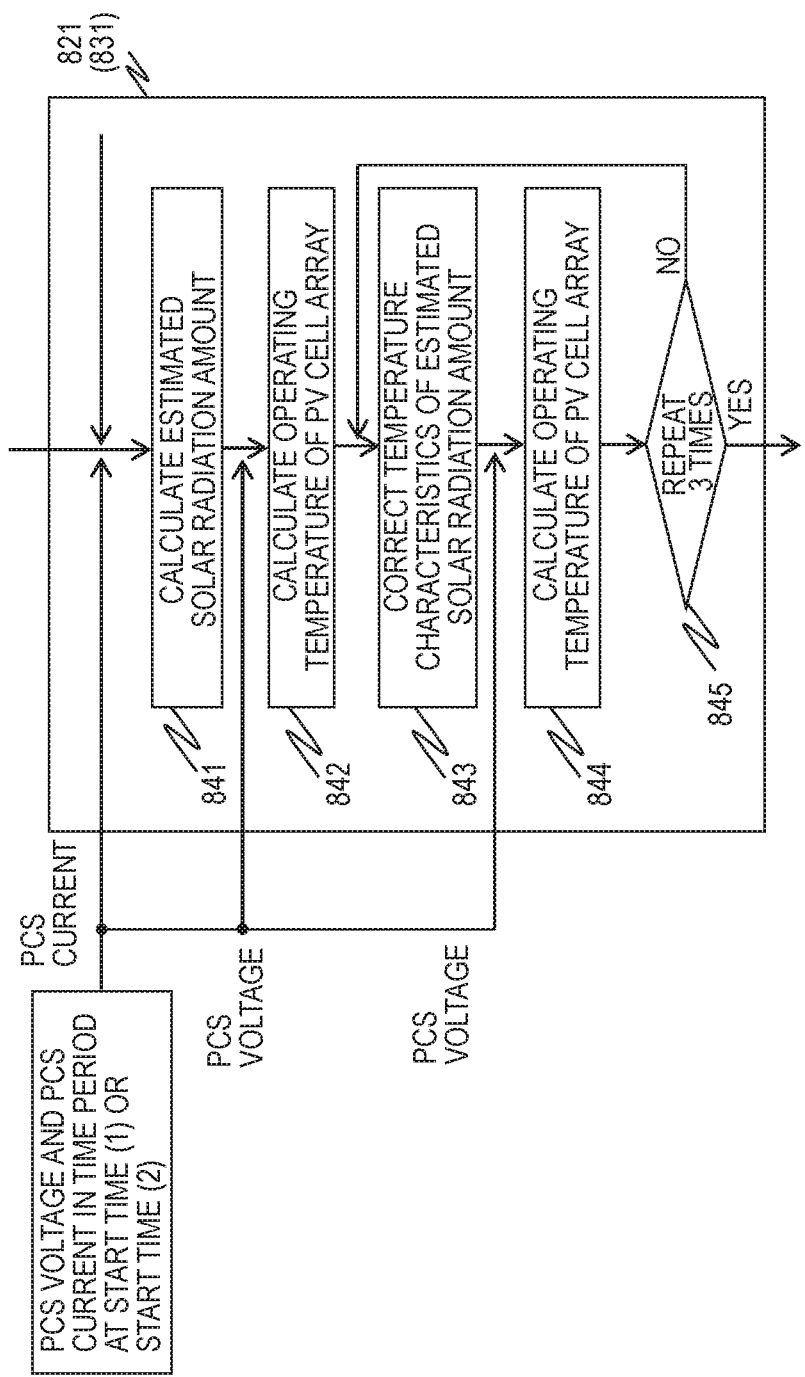
FIG. 8B is a flow chart showing one example of a process to calculate the estimated solar radiation amount and estimated temperature of the PV power system according to Embodiment 1 of the present invention.

FIG. 8B is a flow chart showing one example of a process to calculate the estimated solar radiation amount and estimated temperature of the PV power system according to Embodiment 1 of the present invention.

Below, details of step 821 will be described, but the description can also be applied to step 831 by replacing Vop1, Iop1, the estimated solar radiation amount 1, and the estimated temperature 1 with Vop2, Iop2, the estimated solar radiation amount 2, and the estimated temperature 2, respectively.

First, the monitoring device 3j calculates the estimated solar radiation amount 1 using formulae (4) and (5) with the operating temperature Tb as 25° C. (step 841). Then, the monitoring device 3j calculates the estimated temperature 1 from the PCS voltage Vop1 using formula (11) (step 842). Then, the monitoring device 3j corrects the temperature of the estimated solar radiation amount 1 using formulae (2) and (3) (step 843).

Then, the monitoring device 3j once again calculates the estimated temperature 1 from the PCS voltage Vop1 (step 844). The monitoring device 3j determines whether the number of repetitions of steps 843 and 844 has reached a prescribed number (three times, for example) (step 845), and if not, loops through steps 843 and 844 repeatedly until the prescribed number is reached. If it is determined in step 845 that the number of repetitions has reached the prescribed number, then it is thought that the estimated solar radiation amount 1 and estimated temperature 1 have sufficiently converged, and thus, the monitoring device 3j ends the process of step 821 and progresses to step 822.

The purpose of step 845 is to determine the convergence of the estimated solar radiation amount 1 and the estimated temperature 1, and the specific method therefor is not limited to what was described above. In other words, the monitoring device 3j may determine convergence on the basis of the number of repetitions as described above, or can determine convergence if a comparison of the current estimated solar radiation amount 1 and estimated temperature 1 with the previous estimated solar radiation amount 1 and estimated temperature 1 indicates that the difference therebetween is less than or equal to a prescribed value.

After the estimated solar radiation amount and estimated temperature converge, the monitoring device 3j calculates the PCS estimated current of the operating voltage V'op1 using formula (1) and array operation according to the conditions of estimated solar radiation amount 1 and estimated temperature 1 determined in step 821 during the time period of the start time (1) (step 822), and compares the calculated PCS estimated current with the PCS current Iop1 (step 823). If the PCS current Iop1, which is a measured value, is less than the PCS estimated current, which is a calculated value, then the monitoring device 3j increases the fault value 1 by a prescribed number (such as 1) (step 824), and returns to step 821. In other words, the monitoring device 3j repeats the operation block 820 while incrementing the fault value 1 until the PCS current Iop1 reaches the same value as the PCS estimated current. In this manner, the fault value 1 is set such that the PCS current Iop1 reaches the same value as the PCS estimated current. The monitoring device 3j may determine that the PCS current Iop1 and the PCS estimated current are equal when the difference therebetween is less than a prescribed value.

The monitoring device 3j may set the fault value 1 as "0" when initially executing the operation block 820, and then repeatedly loop through the operation block 820 while incrementing the fault value 1 by 1 each time, for example. The fault value 1 is the number of faulty PV cell modules 1g, for example, and if there are an N number of PV cells 1f included in the PV cell module 1g, increasing the fault value 1 by 1 reduces Ncell in the equation above by N, which results in a change in the calculation results of steps 821 and 822.

After step 804, the monitoring device 3j performs a similar calculation to the operation block 820 in the operation block 830 during the time period at the start time (2), to calculate a fault value 2. The steps 831 to 834 of the operation block 830 are similar, respectively, to steps 821 to 824 of the operation block 820, and thus, descriptions thereof are omitted.

Lastly, the monitoring device 3j compares the fault value 1 with the fault value 2 (step 805). If the series resistance Rs is far from the true value, the fault value 1 and fault value 2 diverge from each other, and thus, if the difference between the fault value 1 and the fault value 2 is greater than a prescribed value, the monitoring device 3j determines that the series resistance Rs set at that time differs from the true value and changes the series resistance Rs (step 806), and then returns to steps 803 and 804 in which the operating voltages V'op1 and V'op2 at the initial state of the PV cell array are determined, for example. In other words, the monitoring device 3j repeats steps 803 and 804 and operation blocks 820 and 830 while changing the value of Rs until the condition of the fault value 1 matching the fault value 2 or the difference therebetween being within a threshold is satisfied.

If the fault value 1 matches the fault value 2, or the difference therebetween is within a threshold, then it is determined that the fault values 1 and 2 and the series resistance Rs set at that point in time are sufficiently close to the true values, and the process of FIGS. 8A and 8B ends. The fault value 1 set when the process of FIGS. 8A and 8B has ended (equal to the fault value 2) is acquired as a value representing the degree of loss resulting from a fault, and the value of Rs set at that point is acquired as a value representing the degree of degradation. These values are stored in the memory 32j. The monitoring device 3j may output the result of estimation by the process above in order to provide this result to a manager of the PV power system. Specifically, the monitoring device 3j may output the estimated fault value and the Rs value itself, for example, or the monitoring device 3j may calculate from these values the loss resulting from a fault, the loss resulting from degradation, and the like, and output the results (see FIGS. 10A and 10B).

FIGS. 10A and 10B are descriptive views of an example of screens displayed in the PV power system according to Embodiment 1 of the present invention.

FIG. 10A is a display example of diagnosis results of the PV cell array 2a for each power conditioner 3, which are measurement units of voltage and current. In this example, for each power conditioner 3, the date and time when diagnosis was performed (in other words, when the PCS voltage and PCS current to be diagnosed were measured), the loss resulting from a fault acquired as a diagnosis result, and loss resulting from degradation (degradation rate) are displayed. In this example, for each diagnosis result, there is a field to input selection of "5 second data display," and when a manager operates this field (by clicking, for example), as shown in FIG. 10B, the PCS voltages and PCS currents are displayed in parallel for every 5 seconds at the time period at the start time (1) and the time period at the start time (2) used for acquiring the diagnosis results.

By the process flow described above, the PV power system of the present embodiment uses measurement means, communication means, and the like used in normal PV power systems to detect with high accuracy the fault value and series resistance for a module present in the PV cell array while understanding with high accuracy the solar radiation amount incident on the PV cell array and operating temperature, without the addition of other measurement means, communication means, actinometers, thermometers, or the like.

Embodiment 2

Next, Embodiment 2 of a diagnostic method for a PV power system will be described. Aside from the differences described below, the various components of the system of Embodiment 2 have the same functions as the components of Embodiment 1 that are displayed in FIGS. 1 to 8B and that are assigned the same reference characters, and thus, descriptions thereof are omitted.

During the two selected time periods, the monitoring device 3j of Embodiment 2 does not estimate initial characteristics of the PV cell array, but first performs the two processes of calculating the solar radiation amount incident on the PV cell array and calculating the estimated temperature of the PV cell array, determines the fault value including overall degradation (loss resulting from series resistance), and calculates the series resistance according to the difference between the fault value 1 and fault value 2. Details of these processes will be explained below.

As shown in FIGS. 5A and 5B, if loss occurs as a result of series resistance, the amount of loss resulting from a high solar radiation condition becomes great as a result of the relationship between the Rs×Iop1 voltage drop and the Rs×Iop2. By contrast, if a line disconnection fault occurs in which the bypass diode 1e turns ON, then the ratio of PV cell modules that cannot be used for power generation to PV cell modules that can be used shifts towards loss, which means the loss is constant regardless of the amount of solar radiation.

Using this relationship, the monitoring device 3j first calculates a loss 1 by formula (12) for the fault value 1 calculated while determining the estimated solar radiation amount and estimated temperature in the time period at the start time (1).

$$\text{loss 1} = \text{fault value 1/total number of modules} \quad (12)$$

If all loss 1 components are assumed to be a result of the series resistance, then formula (13) applies.

$$\text{loss 1} = \text{fault value 1/total number of modules} = Rs \times Iop1/(Vop1 + Rs \times Iop1) \quad (13)$$

Similarly, the monitoring device 3j calculates a loss 2 by formula (14) in the time period at the start time (2).

$$\text{loss 2} = \text{fault value 2/total number of modules} = Rs \times Iop2/(Vop2 + Rs \times Iop2) \quad (14)$$

In other words, if loss 1=loss 2, then according to the simultaneous equations of formulae (13) and (14), Rs=0 and all loss can be seen as loss components by a faulty module, whereas if loss 1>loss 2, then the series resistance Rs is determined according to formulae (13) and (14), which means the loss components resulting from overall degradation are quantified.

Figure 9:
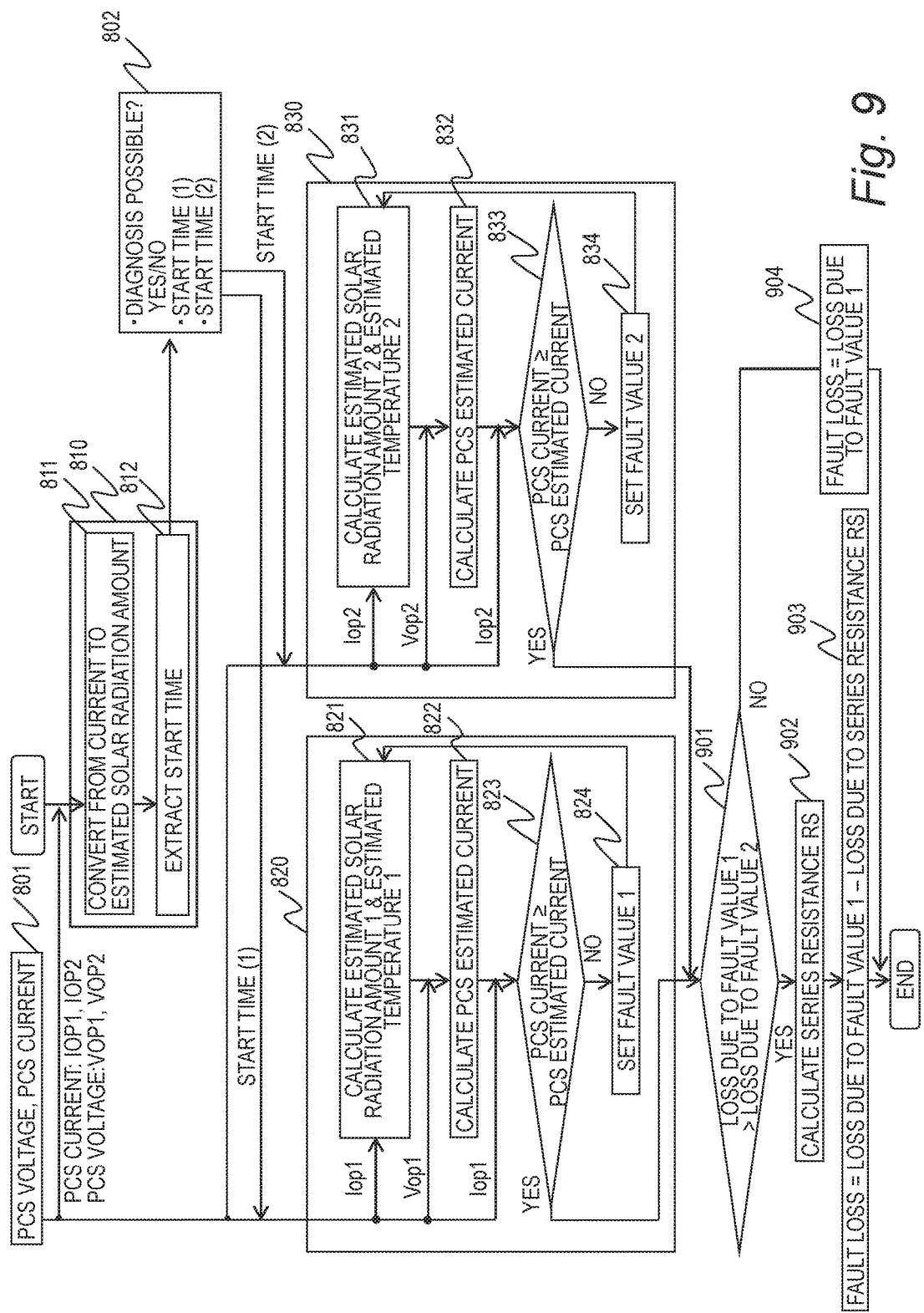
FIG. 9 is a flow chart showing one example of an operation algorithm of all processes to calculate the fault value and series resistance of a PV power system according to Embodiment 2 of the present invention.

FIG. 9 is a flow chart showing one example of an operation algorithm of all processes to calculate the fault value and series resistance of the PV power system according to Embodiment 2 of the present invention.

The process shown in FIG. 9 is similar to the process shown in FIGS. 8A and 8B except that the process shown in FIG. 9 omits steps 803 and 804, and steps 805 and 806 are replaced by steps 901 to 904. The reason that steps 803 and 804 are omitted is because in the operation blocks 820 and 830 of the present embodiment, Rs is set to 0 (that is, V'op1=Vop1 and V'op2=Vop2). As a result of steps 805 and 806 being replaced by steps 901 to 904, the loop in which the process returns from step 806 to a step prior to the operation blocks 820 and 830 is also omitted in FIG. 9.

When the fault value 1 and fault value 2 are calculated, respectively, in operation blocks 820 and 830, the monitoring device 3j divides these values by the number of modules present in the PV cell array, calculates the loss resulting from the fault value 1 and the loss resulting from the fault value 2, and compares the two (step 901).

If the Rs value set in the calculation above matches the true Rs value, then the calculated loss resulting from the fault value 1 and loss resulting from the fault value 2 should be equal. Thus, if in step 901 the difference between the loss resulting from the fault value 1 and the loss resulting from the fault value 2 is less than a prescribed threshold, for example, then the monitoring device 3j determines that the two are equal, and detects the loss resulting from the fault value 1 to be loss resulting from a fault (step 904). In such a case, the loss resulting from the set Rs is detected as loss resulting from overall degradation. If Rs is set as 0 as in the above example, then the loss resulting from overall degradation is estimated to be 0.

On the other hand, if the Rs value set in the calculation above does not match the true Rs value, then the loss resulting from the fault value 1 and loss resulting from the fault value 2 would not be equal. If Rs is set to 0 in the operation blocks 820 and 830 but in reality Rs is not 0 due to degradation, for example, then the calculated loss resulting from the fault value 1 would be greater than the loss resulting from the fault value 2. In such a case, the monitoring device 3j determines the series resistance Rs from the simultaneous equations of formulae (13) and (14), and calculates the loss resulting from overall degradation (step 902). Lastly, the monitoring device 3j calculates a value by subtracting the loss resulting from overall degradation from loss resulting from the fault value 1, and detects this calculated value as the loss resulting from a fault (step 903).

By the process flow described above, the PV power system of the present embodiment detects with high accuracy the fault value and series resistance for a module present in the PV cell array while knowing with high accuracy the solar radiation amount incident on the PV cell array and operating temperature. The monitoring device 3j can output the losses differentiated as described above in a manner similar to Embodiment 1 (see FIGS. 10A and 10B, for example).

According to the present invention described above, a low cost fault diagnostic method that does not require the addition of a measurement means or communication means can be used in a large scale PV cell system, and has very high utility.

The present invention is not limited to the embodiment above, and includes various modification examples. The embodiment above was described in detail in order to explain the present invention in an easy to understand manner, but the present invention is not necessarily limited to including all configurations described, for example. It is possible to replace a portion of the configuration of one embodiment with the configuration of another embodiment, and it is possible to add to the configuration of the one embodiment a configuration of another embodiment. Furthermore, other configurations can be added or removed, or replace portions of the configurations of the respective embodiments.

Some or all of the respective configurations, functions, processing units, processing means, and the like can be realized with hardware such as by designing an integrated circuit, for example. Additionally, the respective configurations, functions, and the like can be realized by software by the processor interpreting programs that execute the respective functions and executing such programs. Programs, data, tables, files, and the like realizing respective functions can be stored in a storage device such as a non-volatile semiconductor memory, a hard disk drive, or a solid state drive (SSD), or in a computer-readable non-transitory data storage medium such as an IC card, an SD card, or a DVD.

Control lines and data lines regarded as necessary for explanation have been described, but not all control lines and data lines in the product have necessarily been shown. In reality, almost all components can be thought of as connected to each other.

What is claimed is:

1. A diagnostic method for a photovoltaic power system that is executed by a computer system having a processor and a storage device connected to the processor,
    wherein the photovoltaic power system has a photovoltaic cell array including a plurality of photovoltaic cells connected to each other,
    wherein the storage device stores measured values of voltage and current that are outputted by the photovoltaic cell array, and
    wherein the diagnostic method for the photovoltaic power system comprises:
        a first step in which the processor identifies a first time period, and a second time period in which a solar radiation amount incident on the photovoltaic cell array is less than in the first time period;
        a second step in which the processor calculates a number of faulty said photovoltaic cells on the basis of the measured values in the first time period;
        a third step in which the processor calculates a number of faulty said photovoltaic cells on the basis of the measured values in the second time period; and
        a fourth step in which the processor compares the number of faulty said photovoltaic cells as calculated for the first time period, and the number of faulty said photovoltaic cells as calculated for the second time period, and, on the basis of results thereof, identifies a series resistance of the photovoltaic cells and a value indicating a degree of loss resulting from a fault in the photovoltaic cells.

2. The diagnostic method for a photovoltaic power system according to claim 1,
    wherein, in the second step, the processor
        calculates the solar radiation amount incident on the photovoltaic cell array and an operating temperature of the photovoltaic cell array for the first time period on the basis of characteristics of each said photovoltaic cell array in a reference state, the measured values, the series resistance set for each of the photovoltaic cells, and the set number of faulty said photovoltaic cells,
        calculates an estimated current of the photovoltaic cell array for the first time period according to the calculated solar radiation amount and operating temperature, and
        sets the number of faulty said photovoltaic cells such that the estimated current of the photovoltaic cell array for the first time period matches the measured current outputted by the photovoltaic cell array during the first time period, and
    wherein, in the third step, the processor
        calculates the solar radiation amount incident on the photovoltaic cell array and the operating temperature of the photovoltaic cell array for the second time period on the basis of characteristics of each said photovoltaic cell array in the reference state, the measured values, the series resistance set for each of the photovoltaic cells, and the set number of faulty said photovoltaic cells,
        calculates an estimated current of the photovoltaic cell array for the second time period according to the calculated solar radiation amount and operating temperature, and
        sets the number of faulty said photovoltaic cells such that the estimated current of the photovoltaic cell array for the second time period matches the measured current outputted by the photovoltaic cell array during the second time period.

3. The diagnostic method for a photovoltaic power system according to claim 2,
    wherein the processor executes the second to fourth steps repeatedly until, in the fourth step, the number of faulty said photovoltaic cells as calculated for the first time period is determined to equal the number of faulty said photovoltaic cells as calculated for the second time period, and
    wherein, in the fourth step, the processor
        modifies the series resistance set for each of the photovoltaic cells if the number of faulty said photovoltaic cells as calculated for the first time period does not equal the number of faulty said photovoltaic cells as calculated for the second time period, and
        identifies the series resistance set for each of the photovoltaic cells as the series resistance of each of the photovoltaic cells, and identifies the number of faulty said photovoltaic cells as calculated for the first time period as a value indicating a degree of loss due to a fault in the photovoltaic cells, if the number of faulty said photovoltaic cells as calculated for the first time period equals the number of faulty said photovoltaic cells as calculated for the second time period.

4. The diagnostic method for a photovoltaic power system according to claim 2,
    wherein, in the fourth step, the processor
        calculates the series resistance of each of the photovoltaic cells on the basis of a difference between the number of faulty said photovoltaic cells as calculated for the first time period and the number of faulty said photovoltaic cells as calculated for the second time period, and calculates as a value indicating a degree of loss due to a fault in the photovoltaic cells a value attained by subtracting loss based on the calculated series resistance from the loss resulting from a fault in the photovoltaic cells, the number of which was calculated for the first time period, if the number of faulty said photovoltaic cells as calculated for the first time period does not equal the number of faulty said photovoltaic cells as calculated for the second time period, and calculates the loss resulting from a fault in the photovoltaic cells, the number of which was calculated for the first time period, as a value indicating a degree of loss due to a fault in the photovoltaic cells, if the number of faulty said photovoltaic cells as calculated for the first time period equals the number of faulty said photovoltaic cells as calculated for the second time period.

5. The diagnostic method for a photovoltaic power system according to claim 1, wherein the first step includes a step in which the processor identifies a time period with a greatest solar radiation amount within a prescribed period as the first time period, and identifies a time period with a lowest solar radiation amount within the prescribed period as the second time period.

6. The diagnostic method for a photovoltaic power system according to claim 1, wherein the first step includes a step in which the processor identifies time periods where a change in the solar radiation amount is less than a prescribed value as the first time period and the second time period.

7. A monitoring device for a photovoltaic power system, comprising:

a processor; and a storage device connected to the processor, wherein the photovoltaic power system has a photovoltaic cell array including a plurality of photovoltaic cells connected to each other, wherein the storage device stores measured values of voltage and current that are outputted by the photovoltaic cell array, and wherein the processor executes:

a first step of identifying a first time period, and a second time period in which a solar radiation amount incident on the photovoltaic cell array is less than in the first time period;

a second step of calculating a number of faulty said photovoltaic cells on the basis of the measured values in the first time period;

a third step of calculating a number of faulty said photovoltaic cells on the basis of the measured values in the second time period;

a fourth step of comparing the number of faulty said photovoltaic cells as calculated for the first time period, and the number of faulty said photovoltaic cells as calculated for the second time period, and, on the basis of results thereof, identifying a series resistance of the photovoltaic cells and a value indicating a degree of loss resulting from a fault in the photovoltaic cells.

8. The monitoring device for a photovoltaic power system according to claim 7, wherein, in the second step, the processor calculates the solar radiation amount incident on the photovoltaic cell array and an operating temperature of the photovoltaic cell array for the first time period on the basis of characteristics of each said photovoltaic cell array in a reference state, the measured values, the series resistance set for each of the photovoltaic cells, and the set number of faulty said photovoltaic cells, calculates an estimated current of the photovoltaic cell array for the first time period according to the calculated solar radiation amount and operating temperature, and sets the number of faulty said photovoltaic cells such that the estimated current of the photovoltaic cell array for the first time period matches the measured current outputted by the photovoltaic cell array during the first time period, and wherein, in the third step, the processor calculates the solar radiation amount incident on the photovoltaic cell array and the operating temperature of the photovoltaic cell array for the second time period on the basis of characteristics of each said photovoltaic cell array in the reference state, the measured values, the series resistance set for each of the photovoltaic cells, and the set number of faulty said photovoltaic cells, calculates an estimated current of the photovoltaic cell array for the second time period according to the calculated solar radiation amount and operating temperature, and sets the number of faulty said photovoltaic cells such that the estimated current of the photovoltaic cell array for the second time period matches the measured current outputted by the photovoltaic cell array during the second time period.

9. The monitoring device for a photovoltaic power system according to claim 8, wherein the processor executes the second to fourth steps repeatedly until, in the fourth step, the number of faulty said photovoltaic cells as calculated for the first time period is determined to equal the number of faulty said photovoltaic cells as calculated for the second time period, and wherein, in the fourth step, the processor modifies the series resistance set for each of the photovoltaic cells if the number of faulty said photovoltaic cells as calculated for the first time period does not equal the number of faulty said photovoltaic cells as calculated for the second time period, and identifies the series resistance set for each of the photovoltaic cells as the series resistance of each of the photovoltaic cells, and identifies the number of faulty said photovoltaic cells as calculated for the first time period as a value indicating a degree of loss due to a fault in the photovoltaic cells, if the number of faulty said photovoltaic cells as calculated for the first time period equals the number of faulty said photovoltaic cells as calculated for the second time period.

10. The monitoring device for a photovoltaic power system according to claim 8, wherein, in the fourth step, the processor calculates the series resistance of each of the photovoltaic cells on the basis of a difference between the number of faulty said photovoltaic cells as calculated for the first time period and the number of faulty said photovoltaic cells as calculated for the second time period, and calculates as a value indicating a degree of loss due to a fault in the photovoltaic cells a value attained by subtracting loss based on the calculated series resistance from the loss resulting from a fault in the photovoltaic cells, the number of which was calculated for the first time period, if the number of faulty said photovoltaic cells as calculated for the first time period does not equal the number of faulty said photovoltaic cells as calculated for the second time period, and calculates the loss resulting from a fault in the photovoltaic cells, the number of which was calculated for the first time period, as a value indicating a degree of loss due to a fault in the photovoltaic cells, if the number of faulty said photovoltaic cells as calculated for the first time period equals the number of faulty said photovoltaic cells as calculated for the second time period.

11. The monitoring device for a photovoltaic power system according to claim 7, wherein, in the first step, the processor identifies a time period with a greatest solar radiation amount within a prescribed period as the first time period, and identifies a time period with a lowest solar radiation amount within the prescribed period as the second time period.

12. The monitoring device for a photovoltaic power system according to claim 7, wherein, in the first step, the processor identifies time periods where a change in the solar radiation amount is less than a prescribed value as the first time period and the second time period.

* * * * *